United States Patent [19]

Baginski et al.

[11] Patent Number: 5,274,273
[45] Date of Patent: Dec. 28, 1993

[54] METHOD AND APPARATUS FOR ESTABLISHING A THRESHOLD WITH THE USE OF A DELAY LINE

[75] Inventors: Mark J. Baginski, Boyd Tavern; Ernest S. Gasser, Tabb; Dale W. Jessen, Charlottesville, all of Va.

[73] Assignee: Sperry Marine Inc., Charlottesville, Va.

[21] Appl. No.: 830,005

[22] Filed: Jan. 31, 1992

[51] Int. Cl.$^5$ .................................. H03K 5/153
[52] U.S. Cl. ............................ 307/358; 307/356; 307/359; 307/362; 307/494
[58] Field of Search ............... 307/356, 358, 359, 362, 307/363, 494, 350, 602, 608

[56] References Cited

U.S. PATENT DOCUMENTS

| | | | |
|---|---|---|---|
| 3,327,139 | 6/1967 | Hillman | 307/363 |
| 4,839,605 | 6/1989 | Trett et al. | 307/358 |
| 4,908,875 | 5/1990 | Assael et al. | 307/358 |
| 4,950,923 | 8/1990 | Garuts | 307/358 |
| 5,015,879 | 5/1991 | Lasagna et al. | 307/358 |
| 5,015,892 | 5/1991 | Parsi et al. | 307/603 |
| 5,142,554 | 8/1992 | Stribling et al. | 307/358 |

Primary Examiner—John S. Heyman
Assistant Examiner—My Trang Ton
Attorney, Agent, or Firm—Seymour Levine

[57] ABSTRACT

A threshold setting circuit receives a signal coupled to the signal terminal of a comparator, delays then amplifies the signal and couples the delayed-amplified signal through a switch to the threshold signal terminal of the comparator. Prior to the reception of a signal which exceeds the threshold, the threshold level is set at the amplified noise level which is stored in storage means coupled to the threshold signal terminal. When the signal exceeds the amplified noise level, the switch is opened prior to the time that the delayed amplified signal is coupled to the threshold signal terminal and stored with the amplified noise in the storage means. Sometime after the signal ceases to exceed the amplified noise threshold level the switch is closed and the storage means tracks the amplified noise to maintain a current threshold level.

6 Claims, 4 Drawing Sheets

METHOD AND APPARATUS FOR ESTABLISHING A THRESHOLD WITH THE USE OF A DELAY LINE

BACKGROUND OF THE INVENTION

1. Field of the Invention

The invention relates to the field of threshold detection, and more particularly to the establishment of a threshold that is solely a function of the receiver noise level.

2. Description of the Prior Art

Received radar signals are normally converted to video signals which are then compared to a threshold level established at the output of the receiver. When the video signal exceeds the established threshold a bona fide signal detection is declared and signal processing commences. The threshold is generally set at a level that is 3 dB above the RMS value of the receiver output noise. Since the RMS value of the receiver noise may vary, a constant threshold level based on a one time measurement of the receiver noise may needlessly limit the sensitivity of the receiver at times when the noise level is low and may give rise to an excessive number of false alarms (a signal indication when no signal is in fact present) when the receiver noise exceeds the level of the noise on which the threshold is based.

Prior art detection systems average the receiver output signal and amplify this average value by 3 dB to establish the threshold signal. This is an adequate threshold when no signal is present. When a signal is present, however, a portion of the signal is averaged with the noise, increasing the threshold until feedback terminates the averaging process. Thus the signal is partially compared to itself resulting in erroneous signal parameters, such as pulse amplitude and pulse width, being reported after processing. Further, the increase in the threshold level reduces the receiver sensitivity, requiring a higher peak video signal level for detection.

SUMMARY OF THE INVENTION

It is an object of the present invention to provide a threshold that is only a function of the noise output of the receiver.

In accordance with the invention, video signals from a radar receiver are coupled to the input terminal of a comparator and to the input terminal of a delay line. The signal at the output terminal of the delay line is amplified and coupled, via a switch which is normally closed, to a storage capacitor which is coupled to comparator threshold terminal. Prior to the arrival of a radar pulse, the video signals comprise the RMS value of the receiver noise. With the switch closed the voltage on the storage capacitor tracks the output voltage of the amplifier. Consequently, the signal coupled to the threshold terminal of the comparator establishes a threshold that is a desired level, set by the gain of the amplifier, above the RMS value of the receiver noise.

When a radar video signal is received that exceeds the threshold level, the comparator provides a signal to open the switch before the amplified delayed radar video signal is coupled to the storage capacitor. Thus the threshold level is maintained by the storage capacitor at the desired level above the RMS noise, uncorrupted by the delayed radar video signal, for the duration of the undelayed radar video signal coupled to the input terminal of the comparator. At a time after the termination of the delayed radar video signal a reset signal is coupled to the switch, causing the switch to close and permitting the signal at the storage capacitor to track the signal at the output terminal of the amplifier.

DESCRIPTION OF THE PREFERRED EMBODIMENTS

Figure 1:
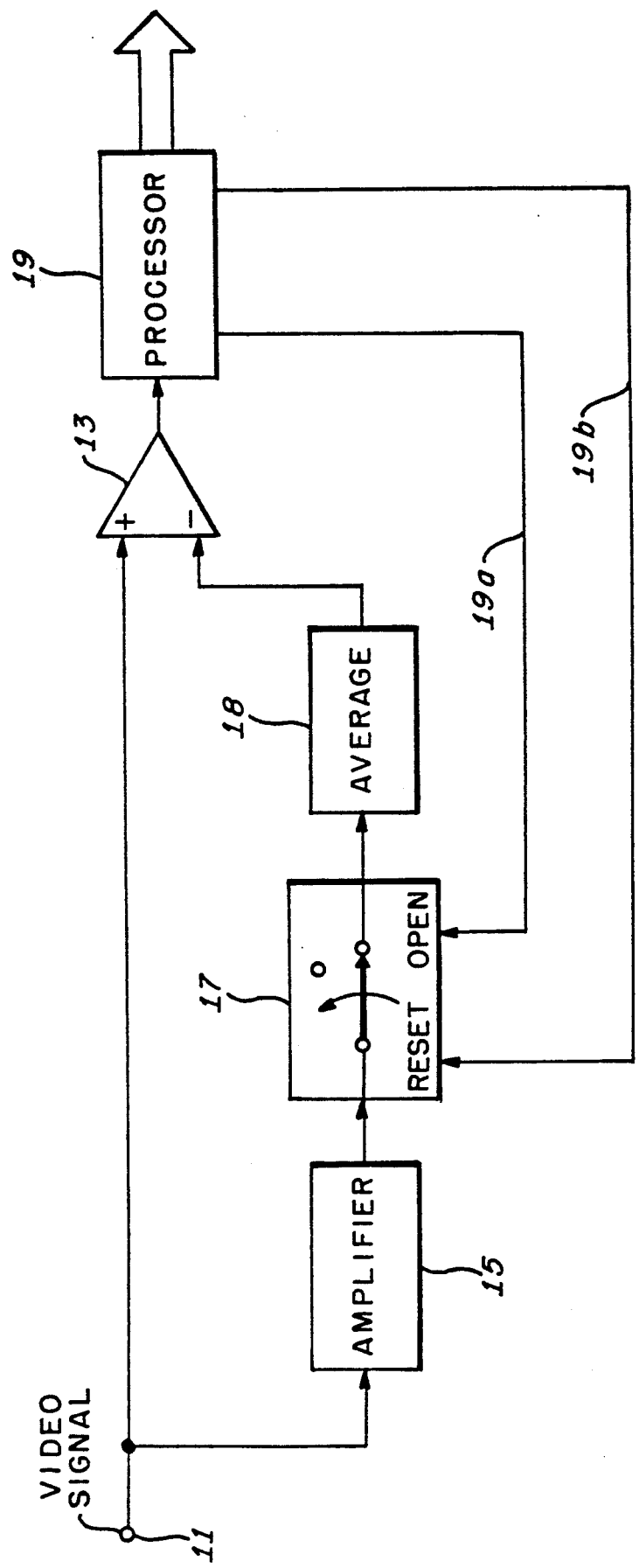
FIG. 1 is a block diagram of a video signal processor with an automatic threshold setting circuit utilized in the prior art.

A video processor 10 of the prior art is shown in FIG. 1. The video processor input terminal 11 is coupled to a comparator 13 and an amplifier 15. The amplifier 15 is coupled via a switch 17 to an averaging circuit 18, the output terminal of which is coupled to the threshold signal terminal of the comparator 13. Prior to the reception of a radar signal video pulse, the noise coupled from the video detection circuit of the receiver is amplified by the amplifier 15. The amplified noise is coupled to the averaging circuit 18 via the switch 19 to establish the comparator threshold signal. Amplification is generally 3 dB. In the absence of a radar video signal this threshold is not exceeded by the noise signal coupled to the comparator 13 positive input terminal.

Figure 4A:
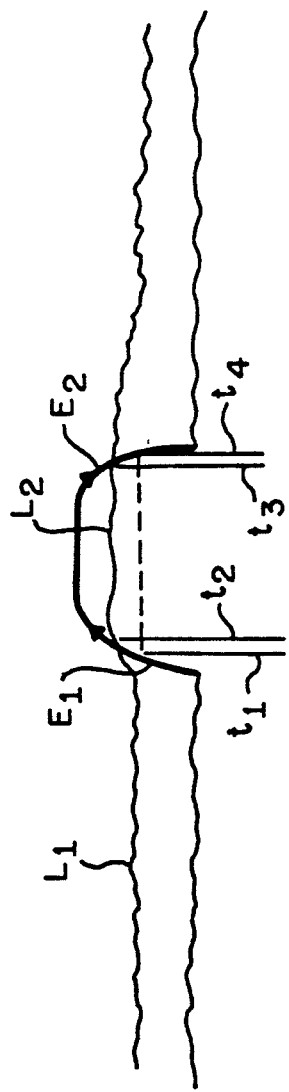
FIGS. 4A–4C are signal representations useful for explaining the operation of the automatic threshold setting circuits of FIGS. 1–3.

When a radar video pulse is received, the leading edge $E_1$ of the pulse does not initially exceed the threshold and it is averaged with the noise, as indicated in FIG. 4A, causing the threshold signal coupled to the threshold signal terminal of the comparator 13 to increase from the pure noise level $L_1$ to the level $L_2$. Thus, the leading edge of the video pulse crosses the threshold $L_2$ at a time $t_2$ which is later than the time $t_1$ at which the leading edge would have crossed the threshold level $L_1$ had a portion of the leading edge not been averaged with the noise.

After the threshold has been crossed at time $t_2$ the output signal of the comparator is detected by a processor 19 wherefrom a signal is coupled via line 19a to open the switch 17. While the switch 17 is open the threshold signal is held by the averaging circuit 18 at the level $L_2$ until the trailing edge $E_2$ has crossed the threshold level $L_2$. This crossing, however, is at a time $t_3$ that is earlier than the time $t_4$ that the trailing edge would have crossed the threshold $L_1$ had the portion of the leading edge not been averaged with the video noise. Upon the crossing of the threshold $L_2$ by the trailing edge $E_2$, the processor 19 provides a signal via line 19b to reset the switch 17 in the closed position and the averaging of the video signal at the input terminal 11 is resumed.

It should be apparent that the increase of the threshold by averaging a portion of the leading edge $E_1$ with the video noise leads to errors in the determination of the width, amplitude, and time of arrival of the received video pulse.

Figure 2:
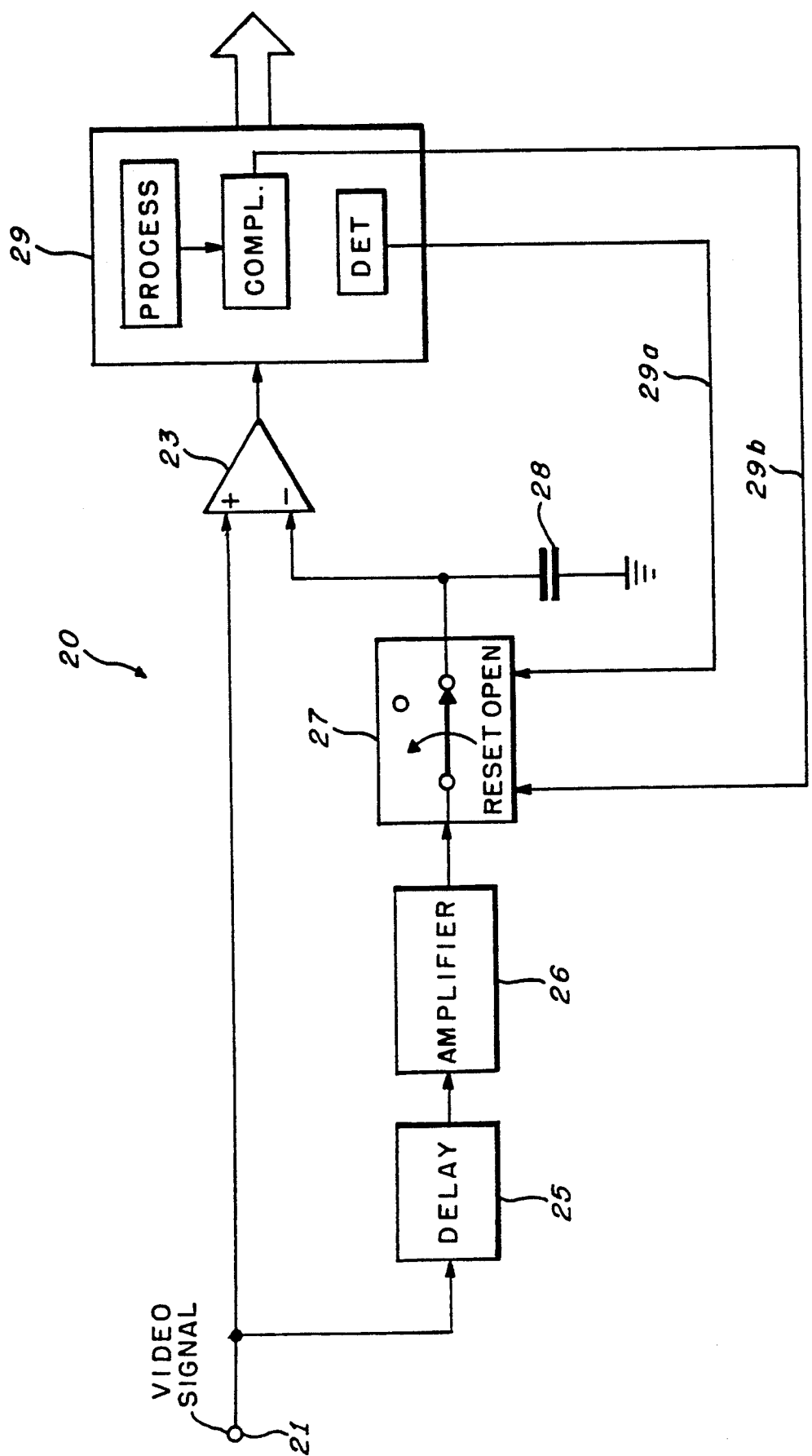
FIG. 2 is a block diagram of a video signal processor with an automatic threshold setting circuit in accordance with a preferred embodiment of the invention.

Refer now to FIG. 2 wherein a block diagram of a video processor 20 is shown which utilizes an embodiment of the present invention. As in the prior art, the received video signal at terminal 21 is coupled to the input terminal of a comparator 23. This received video signal, however, is also coupled to a delay line 25 wherefrom it is coupled to an amplifier 26 wherein it is amplified as previously discussed and coupled, via a switch 27, to the threshold signal terminal of the comparator 23. A capacitor 28, coupled to the threshold signal terminal of the comparator 23 tracks and stores the output signal from the amplifier 26.

Figure 4B:
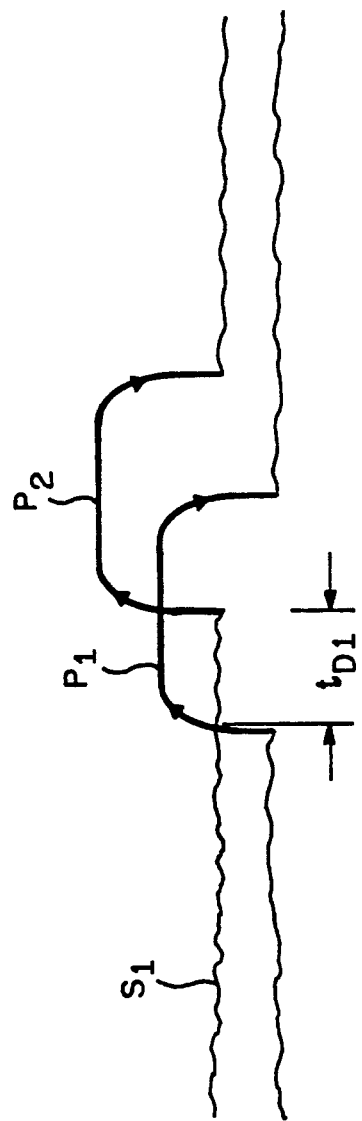

Refer to FIG. 4B with continued reference to FIG. 2. Prior to the reception of a radar video pulse, the amplifier 26 amplifies the RMS noise level, generally by 3 dB, and its output signal $S_1$ is coupled to the threshold signal terminal of the comparator 23 and the storage capacitor 28. The delay $t_{D1}$ provided by the delay line 25 is chosen so that the threshold established by the amplifier 26, by amplifying the RMS noise level, is crossed by the leading edge of a received radar video pulse $P_1$ before an amplified radar video pulse $P_2$ is coupled to the threshold signal terminal of the comparator 23 and the storage capacitor 28. Control logic processor 29 detects the threshold crossing of the radar video pulse and provides a signal via line 29a to open the switch 27. Thus, the switch 27 is opened before the amplified radar video pulse can be coupled to the storage capacitor 28 and the threshold signal terminal of the comparator 23. Sometime after the decay of the trailing edge of the radar pulse $P_1$, as for example the determination of the radar pulse parameters, the processor provides a reset signal via line 29b to reset the switch 27 to the closed position and tracking of the amplifier 26 output signal by the capacitor 28 is reestablished.

Figure 3:
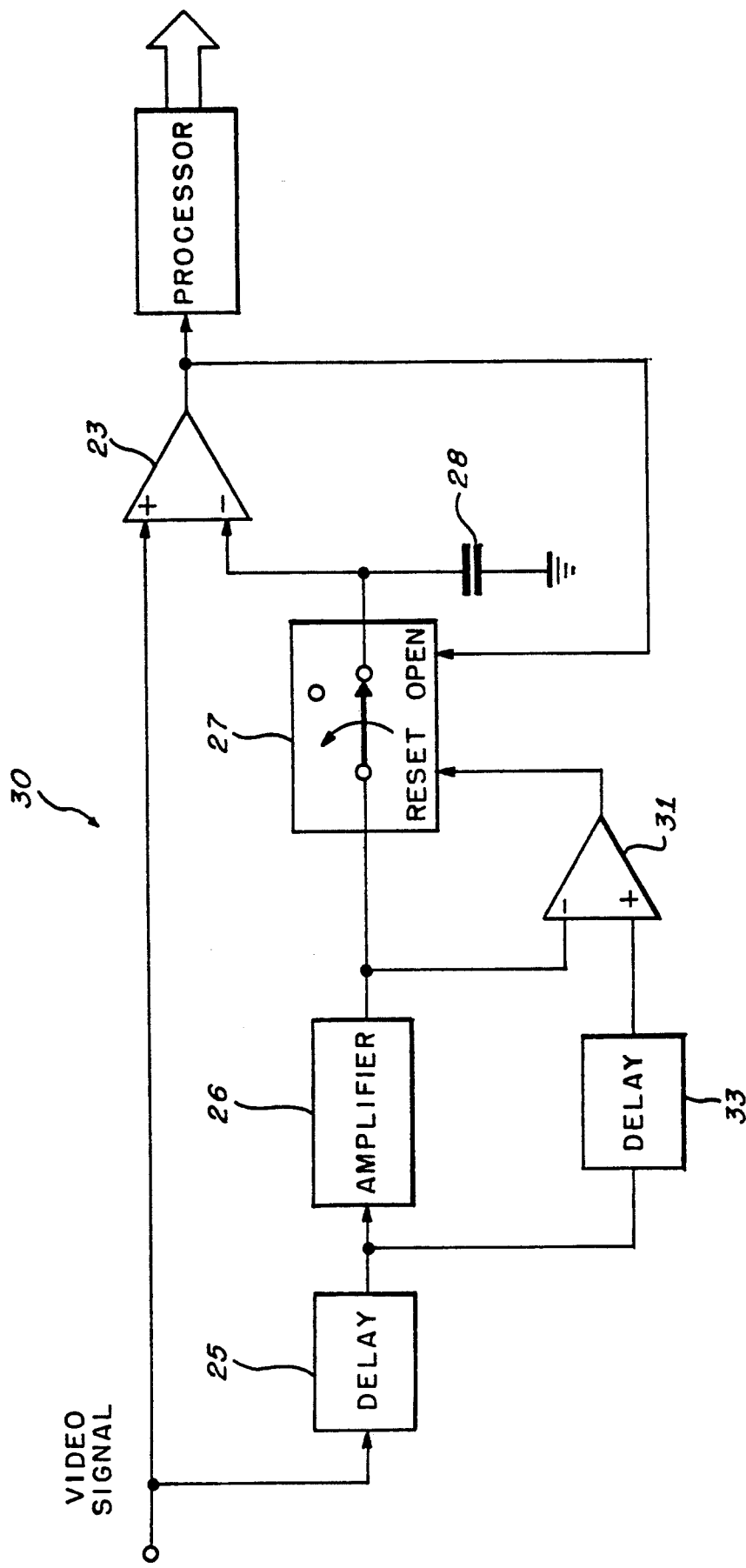
FIG. 3 is a block diagram of a video signal processor with an automatic threshold setting circuit in accordance with a second preferred embodiment of the invention.
Figure 4C:
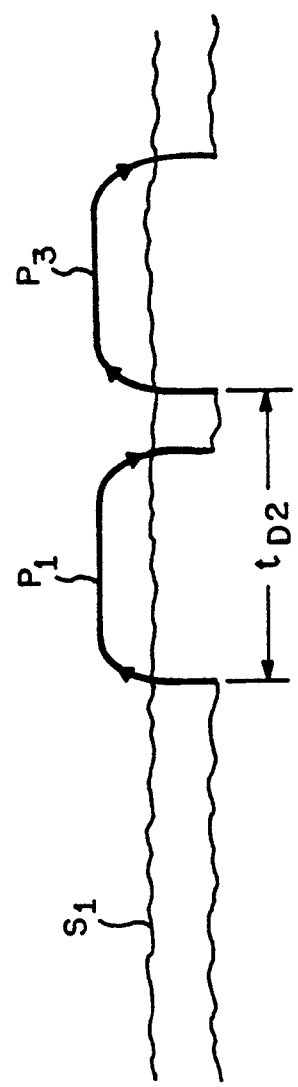

Refer now to FIGS. 3 and 4C wherein previously identified elements bare the originally assigned reference numerals. A video signal processor 30 utilizing a second embodiment of the threshold setting invention is shown in FIG. 3. The video signal at the output of the delay line 25 is coupled to the amplifier 26 and to the signal input of a second comparator 31 via second delay line 33. Video signals traversing the delay line 33 are delayed for a time interval $t_{D2}$ that is at least equal the duration of an anticipated received radar video pulse. Amplified signals from the amplifier 26 are coupled to the normally closed switch 27 and the threshold signal terminal of the comparator 31. This amplified noise signal $S_1$ is therefore a threshold signal for both comparators. Prior to the reception of a radar video pulse the signal at the input terminal of the comparator 31 is at a level below that at the threshold signal terminal and the signal at the output terminal of the comparator 31, which is coupled to the switch 27 reset signal terminal, is at a low level. The switch 27 open signal terminal is coupled to the output terminal of the comparator 23. When the leading edge of the received radar video pulse $P_1$ crosses the threshold level of the comparator 23 the resulting high level signal is coupled to the open the switch 27. After the delay $t_{D2}$, the radar video pulse is at the input terminal of the comparator 31. Since this pulse exceeds the threshold level of the comparator 31 a high level signal is coupled to reset signal terminal of the switch 27 and the switch is reset to the closed position. After the switch is closed, the threshold level of the comparator 23 once again is able to track the amplified noise provided by the amplifier 26.

While the invention has been described in its preferred embodiments, it is to be understood that the words which have been used are words of description rather than of limitation and that changes within the purview of the appended claims may be made without departure from the true scope and spirit of the invention in its broader aspects.

We claim:

1. An apparatus for providing a threshold signal level for a comparator which compares a received signal at an input terminal to a threshold signal at a threshold signal terminal comprising:
   means for providing a first switching signal when said received signal exceeds said threshold signal and a second switching signal at a time interval after said first switching signal;
   means coupled to said input terminal for delaying said received signal for a predetermined time interval;
   switch means coupled between said delaying means and said threshold signal terminal, and additionally coupled to said providing means to receive switching signals, said switch means being normally closed, opened upon receipt of said first switching signal, and reset to closed upon receipt of said second switching signal; and
   signal storage means coupled to said threshold signal terminal for storing said threshold signal.

2. An apparatus in accordance with claim 1 wherein said providing means comprises a processor coupled to said comparator, said processor providing said first switching signal when said received signal exceeds said threshold signal and said second switching signal at a time interval after said received signal has ceased to exceed said threshold.

3. An apparatus for providing a threshold signal level in accordance with claim 1 wherein said delaying means includes a delay line coupled to said input terminal and an amplifier coupled between said delay line and said switch means.

4. An apparatus in accordance with claim 3 wherein said providing means comprises:
   means coupled to said comparator and said switch means for providing said first switching signal when said received signal exceeds said threshold signal;
   further delay means coupled to said delay line for delaying said signal for an additional time interval; and
   a further comparator having a threshold signal terminal coupled to said amplifier and a signal terminal coupled to said further delay means, said further comparator coupled to said switch means for providing said second switching signal.

5. A method for providing a threshold signal to a comparator comprising the steps of:
   delaying a received signal for a time interval to provide a delayed signal;
   coupling said delayed signal to a threshold signal terminal of said comparator via a switch;
   coupling storage means to said threshold signal terminal so that a stored signal is a threshold signal for said comparator;
   opening said switch when an undelayed received signal coupled to a signal terminal of said comparator exceeds said threshold signal; and
   closing said switch at a time from reception of said received signal that exceeds said time interval.

6. A method for providing a threshold signal in accordance with claim 5 wherein the step of delaying said received signal includes the step of amplifying said delayed signal prior to coupling said delayed signal to said threshold signal terminal via said switch.

* * * * *